United States Patent [19]

Michael et al.

[11] Patent Number: 5,221,813
[45] Date of Patent: Jun. 22, 1993

[54] CABLE BLOCK FOR CONTROLLING CABLE ROUTING IN A TERMINAL

[75] Inventors: James A. Michael; Filipe O. Simoes; Alistair R. Hamilton, all of Waterloo, Canada

[73] Assignee: NCR Corporation, Dayton, Ohio

[21] Appl. No.: 805,744

[22] Filed: Dec. 12, 1991

[51] Int. Cl.5 .......................... H02G 3/18; H01B 7/00
[52] U.S. Cl. .................................... 174/65 R; 248/56; 174/135
[58] Field of Search ............. 174/65 R, 135 R, 151 R; 248/56

[56] References Cited

U.S. PATENT DOCUMENTS

| | | |
|---|---|---|
| 2,891,103 | 6/1959 | Swengel . |
| 3,634,608 | 1/1972 | Buhl et al. . |
| 3,742,119 | 6/1973 | Newman . |
| 4,165,105 | 8/1979 | Hahn . |
| 4,178,057 | 12/1979 | McCormick . |
| 4,407,042 | 10/1983 | Schramme et al. . |
| 4,688,747 | 8/1987 | Helmsdorfer et al. ............... 248/56 |
| 5,006,960 | 4/1991 | Kallin et al. . |

Primary Examiner—Harold Broome
Attorney, Agent, or Firm—Elmer Wargo

[57] ABSTRACT

A method and apparatus for controlling the routing of operating cables from a computer or terminal. The apparatus includes a terminal and a cable block. The terminal has a mounting wall and a receiver for detachably securing the cable block thereto. The cable block has a U-shaped housing having an open side which faces the mounting wall and it also has internal dividers to provide open compartments to receive the cables. The U-shaped housing has resilient tangs thereon which cooperate with corresponding tangs on the terminal to detachably secure the cable block to the housing with the cables being routed between the compartments and the mounting wall.

9 Claims, 4 Drawing Sheets

CABLE BLOCK FOR CONTROLLING CABLE ROUTING IN A TERMINAL

BACKGROUND OF THE INVENTION (1) Field of the Invention.

This invention relates to a method and apparatus for controlling the routing of operating cables from a computer or terminal, for example.

(2) Background Information.

One of the problems with routing cables from a terminal, like a computer, for example, is that the cables may vary in size and tolerances, making the fitting of the cables into the terminal difficult. For example, power cables may vary in diameter due to international and domestic requirements. Very often, it is difficult to get a definitive answer from a standards setting body which is to establish standards for particular cables. This makes the decision as to how to accommodate the cables in a terminal difficult to make.

If the cables vary significantly in diameter, it is often necessary to re-design at least the associated part of the terminal housing and the connector to accommodate the changes. Another problem relates to trying to maintain a neat appearance for the cables leaving the terminal while accommodating the variation in sizes among the various cables used.

SUMMARY OF THE INVENTION

An object of this invention is to design a method and apparatus for routing cables from a terminal to enable the apparatus to accommodate a plurality of sizes and tolerances of cables.

Another object of this invention is to design the apparatus so that a replaceable inexpensive part may be used to accommodate a significant change in cable sizes or tolerances without having to re-design portions of the terminal.

Another object of this invention of this invention is to design a neat, controlled entry/exit for the cables associated with a terminal. This reduces the "footprint" or physical size of the terminal by not having bulky connectors located at the rear of the terminal.

In a first aspect of this invention there is provided a combination comprising a terminal and a replaceable cable block for routing cables from the terminal;

said terminal having a mounting wall and receiving means for detachably receiving said cable block;

said cable block having:

a U-shaped housing having an open side facing said mounting wall and also having internal dividers therein to provide open compartments to receive said cables; and mounting means located on said U-shaped housing cooperating with said receiving means to detachably mount said U-shaped housing on said terminal and to route said cables between said U-shaped housing and said mounting wall.

In a second aspect of this invention there is provided a method of routing cables from a terminal in which the cables may have varying diameters and tolerances, comprising the steps of:

(a) designing a cable block as a replaceable part, with the cable block having internal dividers therein to provide open compartments for receiving predetermined numbers, sizes, and tolerances of cables; and (b) designing the terminal to have a mounting wall and a receiving means for detachably receiving said cable block to route the cables, when mounted in said open compartments, between said mounting wall and the cable block.

The apparatus of this invention provides a clean and controlled appearance.

The insertion of cables into the apparatus is simple; this helps to insure that the cables are properly installed in the terminal.

When the apparatus of this invention is used in a table top terminal, for example, connectors associated with the apparatus do not protrude outside the machine; this provides a compact appearance or smaller footprint for the terminal.

The above advantages and features will be more readily understood in connection with the following specification, claims, and drawing.

DESCRIPTION OF THE PREFERRED EMBODIMENT

Figure 1:
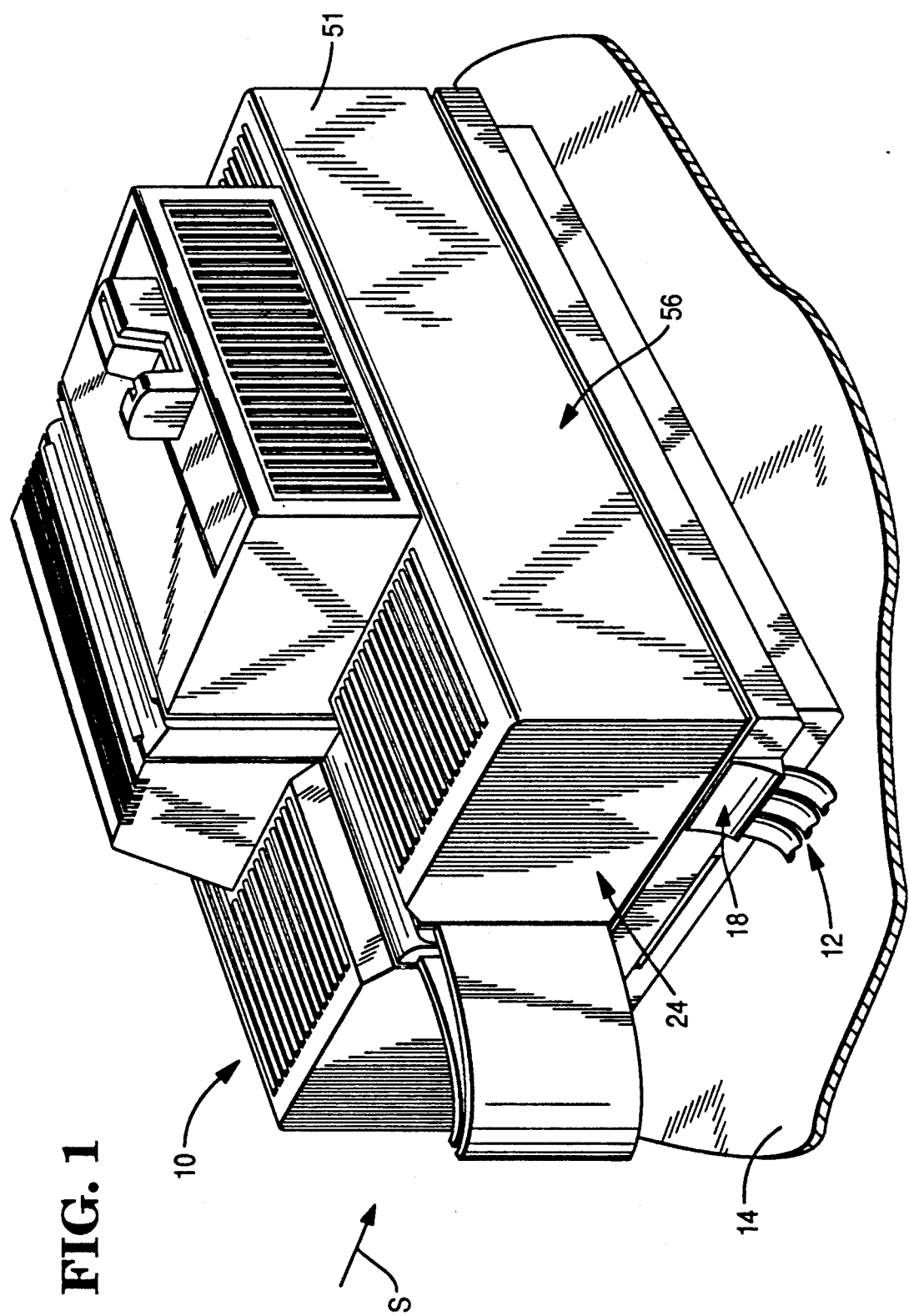
FIG. 1 is a general, perspective view of the rear of a terminal, showing cables being routed from a side of the terminal by the apparatus of this invention.

FIG. 1 is a general, perspective view of a terminal 10 in which the apparatus of this invention, designated generally as 12, may be located. The terminal 10 may be a table top computer, for example, which rests on a table 14. For such a terminal 10, it is important that the terminal occupy a small space on the table 14 or have a small "footprint". It is also important that any cables coming from the terminal 10 present a neat appearance.

Figure 2:
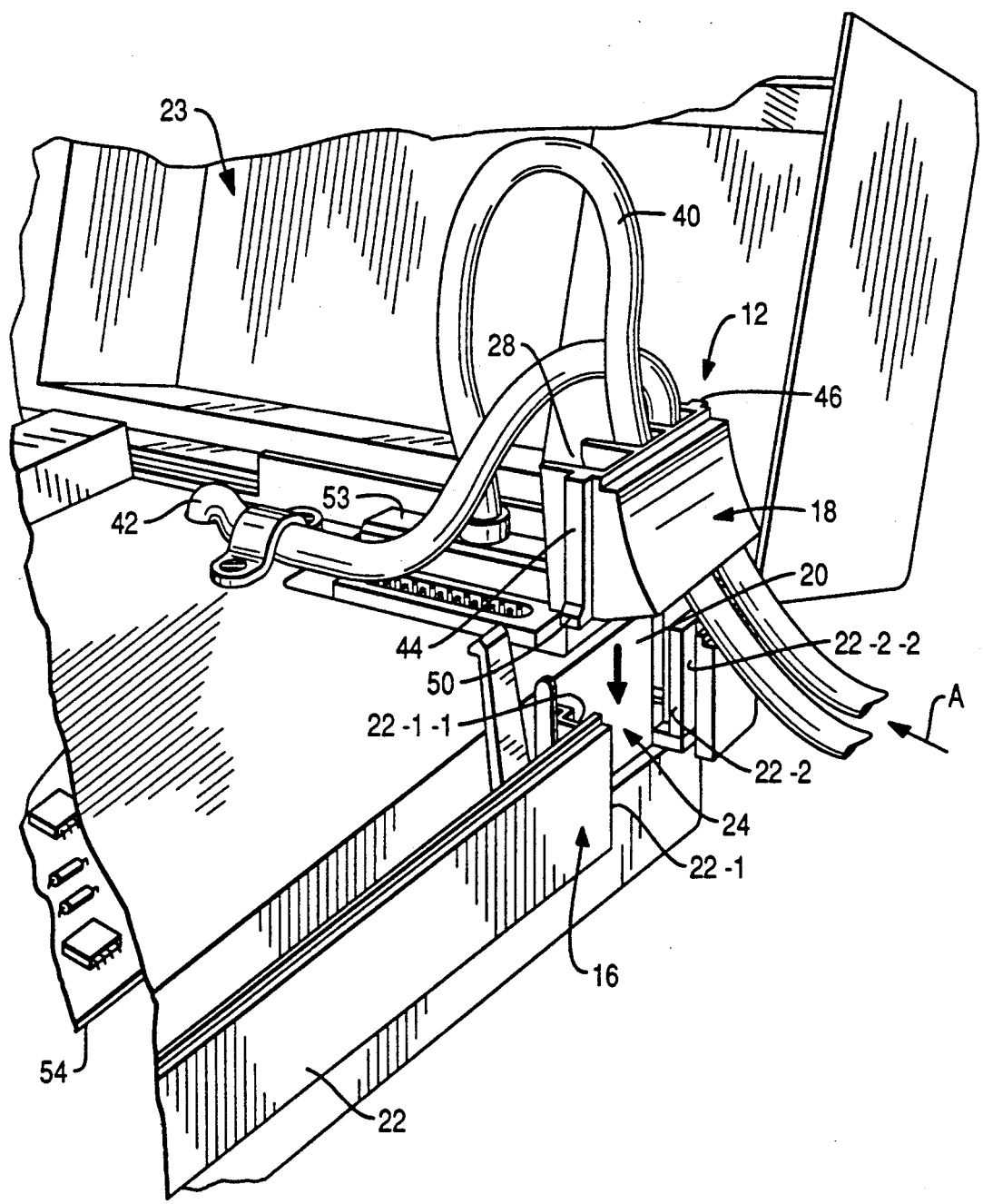
FIG. 2 is a general, perspective view of the terminal shown in FIG. 1, with this view taken from the direction of arrow S shown in FIG. 1, and with the terminal having a cover which is opened to permit the apparatus of this invention to be viewed. The apparatus of this invention includes a cable block which is to be installed in the terminal.

The apparatus 12 of this invention includes a combination of a portion 16 of the terminal 10 and a cable block 18 shown best in FIG. 2. The portion 16 of the terminal 10 includes a mounting wall 20 which is spaced from an outer wall 22 which is part of the terminal 10. The terminal 10 also has a hinged cover 23 which is in the open position shown in FIG. 2 to show the interior of the terminal.

The portion 16 of the terminal 10 includes the outer wall 22 (FIG. 2) which has an opening therein, forming a first side 22-1 and a second side 22-2 to provide a receiving means 24 for detachably receiving the cable block 18. The first side 22-1 has a first groove 22-1-1 formed therein, and the second side 22-2 has a second groove 22-2-2 formed therein as shown.

Figure 3:
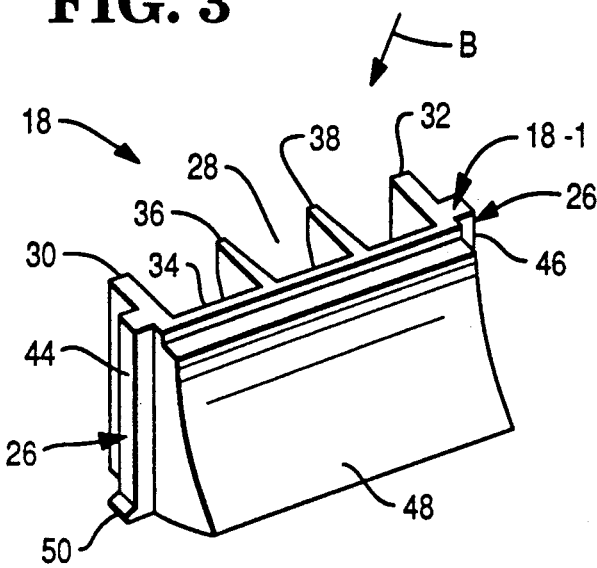
FIG. 3 is a general, perspective view of a housing which is part of the cable block shown in FIG. 2, with FIG. 3 being taken from the direction of arrow A shown in FIG. 2.
Figure 4:
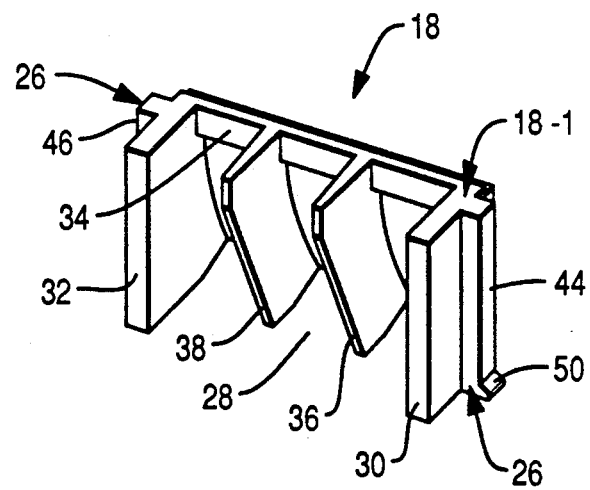
FIG. 4 is a general, perspective view of the housing shown in FIG. 3, with FIG. 4 being taken from the direction of arrow B shown in FIG. 3.

The cable block 18 (FIGS. 3 and 4) has a housing 18-1 and mounting means 26 thereon which cooperate with the receiving means 24 on the portion 16 of the terminal 10 to detachably mount the housing 18-1 in the receiving means 24. The housing 18-1 is generally U-shaped in configuration and has an open side 28 which faces the mounting wall 20 (FIG. 2) when the cable block 18 is mounted on the terminal 10. The housing 18-1 has side members 30 and 32 and a joining member 34 as shown best in FIGS. 3 and 4. The housing 18-1 also has internal dividers, like 36 and 38, forming compartments to receive cables, like 40 and 42 shown in FIG. 2.

Naturally, the number of dividers, like 36 (FIG. 3) and 38, used will depend upon the particular requirements of a particular application. A feature of this invention is that the spacing and dimensions of the dividers 36 and 38 can be changed to suit changes in the cables used without having to re-design the portion 16 of the terminal 10 to which the cable block 18 is attached. For example, the thicknesses of the dividers 36 and 38 as well as the thicknesses of the side members 30 and 32 can be changed to accommodate substantially different sizes and tolerances of cables. Within a particular embodiment of the cable block 18, a range of cable sizes and tolerances can be accommodated.

Figure 6:
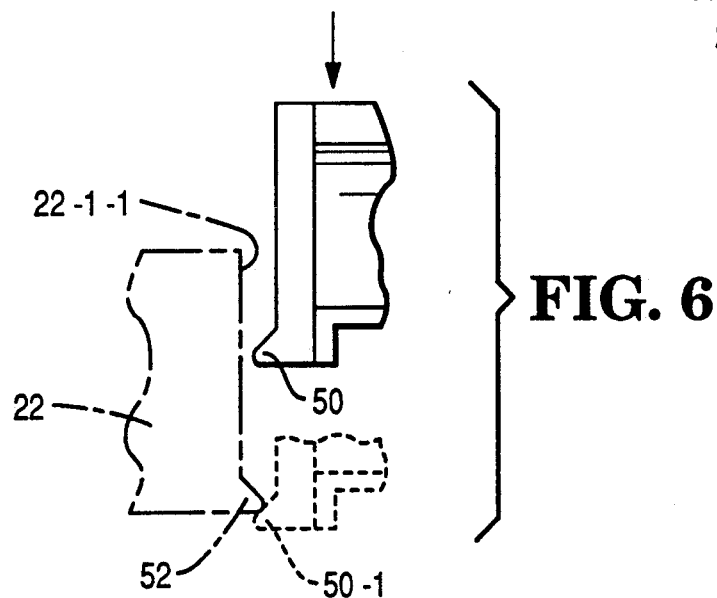
FIG. 6 (shown on the sheet with FIGS. 3 and 4) is a schematic view showing how the cable block is detachably secured in the terminal.
Figure 5:
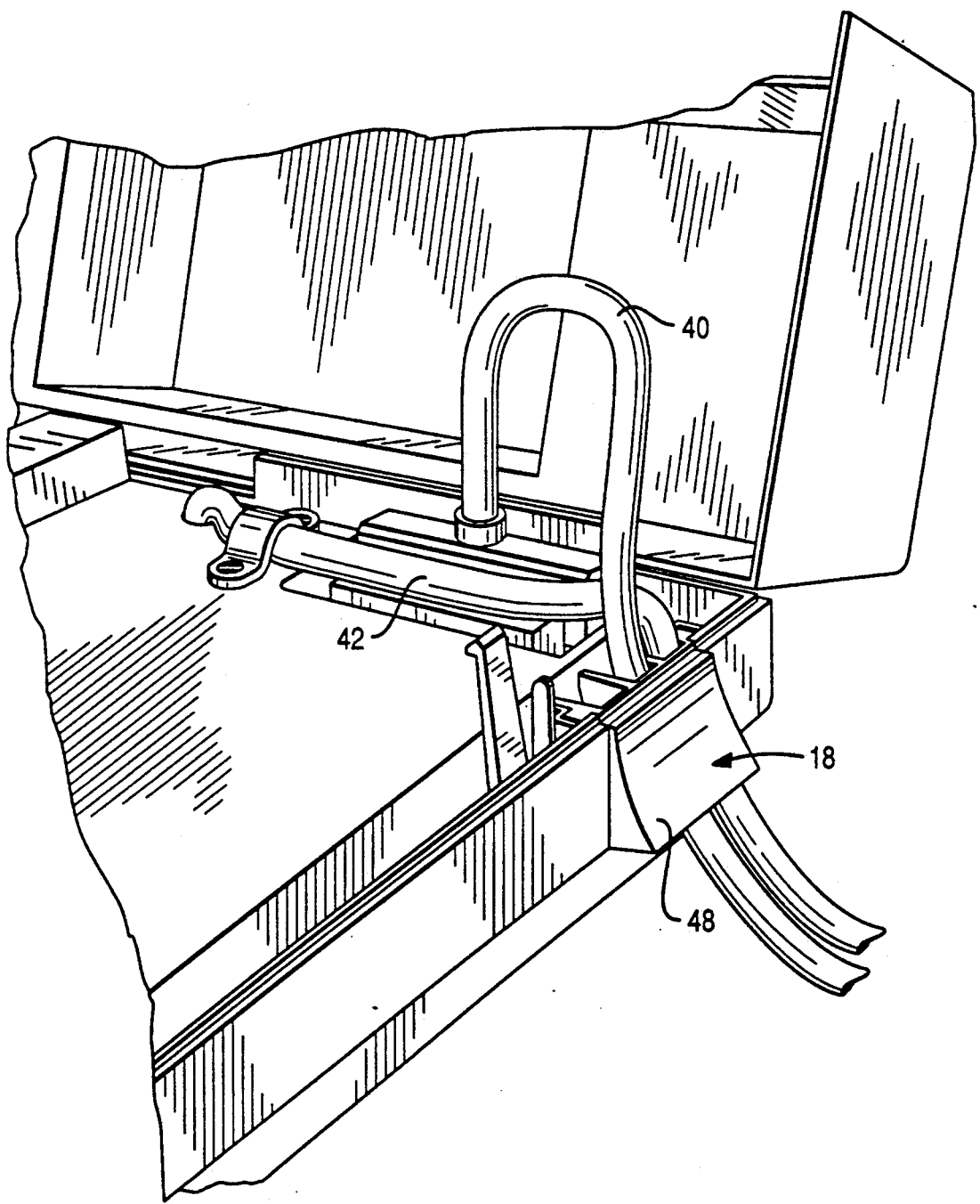
FIG. 5 is a view similar to FIG. 2 showing the cable block in an assembled position in the terminal.

The mounting means 26 on the housing 18-1 (FIGS. 3 and 4) includes a first guide 44 and a second guide 46 which mate with the first and second grooves 22-1-1 and 22-2-2 when the cable block 18 (with the cables 40 and 42 therein) is pushed downwardly as viewed in FIG. 2. The cable block 18 is shown in the assembled position in FIG. 5. In this position, the cable 40, for example, is held in the compartment formed by the internal dividers 36 and 38, and the cable 40 also contacts the mounting wall 20. The cable block 18 also has a flared skirt 48 (FIG. 3) to guide the cables, like 40 and 42, away from the table 14 while minimizing bending stresses in the cables. The mounting means 26 also includes a resilient tang 50, located on each of the first and second guides 44 and 46 to cooperate with a resilient tang 52 (FIG. 6) projecting from the groove 22-1-1 in the outer wall 22. A corresponding tang 52 (not shown) is provided for the groove 22-2-2. When the cable block 18 is pushed downwardly (as described in relation to FIG. 2), the resilient tang 50 snaps below the tang 52 as shown by tang 50-1 (shown in dashed outline) to detachably secure the housing 18-1 of the cable block 18 to the terminal 10. The cable block 18 is made of a plastic material, like polycarbonate.

The method of this invention may be summarized as follows. It is a method of routing cables (like 40, 42) from a terminal (10) in which the cables may have varying diameters and tolerances, comprising the steps of:

(a) designing a cable block (18) as a replaceable part, with the cable block having internal dividers (36, 38) therein to provide open compartments for receiving predetermined numbers, sizes, and tolerances of cables; and (b) designing the terminal (10) to have a mounting wall (20) and a receiving means (24) for detachably receiving said cable block (18) to route the cables (like 40, 42), when mounted in said open compartments, between said mounting wall (20) and the cable block (18).

To summarize, some of the advantages of this invention are as follows:

1. The apparatus 12 is versatile. It permits the use of cables with size variations due to different tolerances and manufacturers.

2. If the cable requirements change significantly, adaptation to the newer requirements is simple and inexpensive. This is because tool modification for the cable block 18 is less expensive than modifying the cabinet 51 of the terminal.

3. The cables, like 40 and 42, are less likely to become dislodged if accidentally pulled on. Depending on the pulling force, the cable block 18 will either restrain the action or become dislodged from its location, thereby popping open the hinged cover 23 and warning the user of the terminal of the problem.

4. The appearance of the terminal 10 is clean and controlled because the cables exit the terminal in an orderly, parallel manner.

5. The insertion of the cable block 18 into the terminal 10 is simple. This helps to insure that the cables are correctly placed in the terminal.

6. The connectors, like 53 in FIG. 2, do not protrude outside the terminal. Thus, the terminal 10 has a small footprint, and the placement of the terminal 10 on a table 14 is not limited to pushing the terminal against a wall. The cable outlet is safe with regard to customers who are exposed to the back of the terminal.

7. The connectors, like 53, are vertically placed (as opposed to some prior art placements of 90 degrees). This reduces the amount of space required on the printed circuit board 54 (FIG. 2); and 8. There is less chance for electrostatic discharge with terminal 10 than prior art terminals because the connectors, like 53, are located within the cabinet 51 (FIG. 1) of the terminal.

What is claimed is:

1. A combination comprising a terminal and a replaceable cable block for routing cables from the terminal;

said terminal having a mounting wall and receiving means for detachably receiving said cable block;

said cable block having:

a U-shaped housing having an open side facing said mounting wall and also having internal dividers therein to provide open compartments to receive said cables; and mounting means located on said U-shaped housing cooperating with said receiving means to detachably mount said U-shaped housing on said terminal and to enable said cables to be routed between said U-shaped housing and said mounting wall.

2. The combination as claimed in claim 1 in which said U-shaped housing and said internal dividers are dimensioned and spaced from each other to accommodate said cables.

3. The combination as claimed in claim 2 in which said housing has a flaired skirt thereon on a side which is opposed to said open side.

4. The combination as claimed in claim 3 in which said terminal has an outer wall in which said receiving means is located.

5. The combination as claimed in claim 4 in which said outer wall has an opening therein forming first and second sides, with said first and second sides having first and second grooves formed therein, respectively, and with said first and second grooves forming part of said receiving means; and in which said U-shaped housing has first and second opposed sides and said mounting means includes first and second guides on said first and second sides respectively, to mate with said first and second grooves, respectively, to mount said U-shaped housing in said receiving means.

6. The combination as claimed in claim 5 in which said receiving means includes at least one resilient member and said mounting means includes at least one resilient member to cooperate with the resilient member in said receiving means to detachably retain said cable block in said terminal.

7. The combination as claimed in claim 6 in which said terminal has a hinged cover and said U-shaped housing has a top portion, with said hinged cover having a portion which contacts said top portion when the hinged cover is in a closed position.

8. A method of routing cables from a terminal in which the cables may have varying diameters and tolerances, comprising the steps of:
   (a) providing a cable block as a replaceable part, with the cable block having internal dividers therein to provide open compartments for receiving predetermined numbers, sizes, and tolerances of cables; and
   (b) providing the terminal to have a mounting wall and a receiving means for detachably receiving said cable block to route the cables, when mounted in said open compartments, between said mounting wall and the cable block.

9. The method as claimed in claim 8 in which said providing step (a) is effected by changing the width and number of said internal dividers to accommodate said predetermined number, sizes, and tolerances of cables.

* * * * *